US011363725B2

(12) United States Patent
Dionne et al.

(10) Patent No.: US 11,363,725 B2
(45) Date of Patent: Jun. 14, 2022

(54) FIXTURE TO HOLD PART BEFORE AND AFTER REFLOW, AND METHOD

(71) Applicant: Universal Instruments Corporation, Conklin, NY (US)

(72) Inventors: Peter Joseph Dionne, Binghamton, NY (US); Bernard Whalen, Montrose, PA (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 186 days.

(21) Appl. No.: 16/760,728

(22) PCT Filed: Nov. 1, 2018

(86) PCT No.: PCT/US2018/058627
§ 371 (c)(1),
(2) Date: Apr. 30, 2020

(87) PCT Pub. No.: WO2019/089879
PCT Pub. Date: May 9, 2019

(65) Prior Publication Data
US 2020/0352036 A1     Nov. 5, 2020

Related U.S. Application Data

(60) Provisional application No. 62/580,533, filed on Nov. 2, 2017.

(51) Int. Cl.
*H05K 1/02*     (2006.01)
*H05K 3/00*     (2006.01)
(Continued)

(52) U.S. Cl.
CPC .......... *H05K 3/3485* (2020.08); *H05K 3/363* (2013.01); *H05K 13/046* (2013.01)

(58) Field of Classification Search
CPC ............ H05K 1/02; H05K 1/046; H05K 3/00; H05K 3/30; H05K 3/32; H05K 3/303;
(Continued)

(56) References Cited

U.S. PATENT DOCUMENTS 4,792,302 A    12/1988   Baker et al.
4,906,194 A *   3/1990   Grabbe ................ H01R 12/714
                                                       439/71
(Continued)

FOREIGN PATENT DOCUMENTS

DE      112013004281 T5     5/2015
EP            2264113 A2     12/2010
(Continued)

OTHER PUBLICATIONS

Application No. PCT/US2018/58627, International Search Report and the Written Opinion of the International Searching Authority, or the Declaration dated Jan. 3, 2019. 14 pages.

*Primary Examiner* — Xiaoliang Chen
(74) *Attorney, Agent, or Firm* — Schmeiser, Olsen & Watts, LLP

(57) ABSTRACT

A clamping assembly for use in a pick and place assembly process includes a fixture and a carrier. The fixture includes at least one retaining feature configured to releasably secure to the carrier such that a part and a substrate are clamped together between the fixture and the carrier.

7 Claims, 17 Drawing Sheets

(51) Int. Cl.
| | |
|---|---|
| *H05K 3/30* | (2006.01) |
| *H05K 3/32* | (2006.01) |
| *H05K 7/00* | (2006.01) |
| *H05K 7/10* | (2006.01) |
| *H05K 13/00* | (2006.01) |
| *H01L 21/02* | (2006.01) |
| *H01L 21/687* | (2006.01) |
| *H01L 23/00* | (2006.01) |
| *H01L 23/34* | (2006.01) |
| *H01L 23/36* | (2006.01) |
| *H01L 23/42* | (2006.01) |
| *H01L 23/427* | (2006.01) |
| *H01L 23/467* | (2006.01) |
| *H05K 3/34* | (2006.01) |
| *H05K 3/36* | (2006.01) |
| *H05K 13/04* | (2006.01) |

(58) Field of Classification Search
CPC .... H05K 3/325; H05K 3/3415; H05K 3/3485; H05K 7/00; H05K 7/10; H05K 7/1007; H05K 7/1061; H05K 7/1069; H05K 7/1431; H05K 13/00; H01L 21/02; H01L 21/687; H01L 23/00; H01L 23/34; H01L 23/36; H01L 23/40; H01L 23/42; H01L 23/427; H01L 23/467; H01L 23/3675; H01L 23/4006; H01L 23/4093
USPC .............. 361/760, 704, 719, 768, 784, 825; 439/66, 71, 73, 91, 330, 331, 607.07, 439/923; 29/428, 559, 592.1, 739, 748, 29/759, 832, 874
See application file for complete search history.

(56) References Cited

U.S. PATENT DOCUMENTS

| | | | | |
|---|---|---|---|---|
| 4,969,826 A * | 11/1990 | Grabbe | ............... | H05K 7/1069 439/937 |
| 5,037,312 A * | 8/1991 | Casciotti | ............. | H05K 7/1061 439/91 |
| 5,123,849 A * | 6/1992 | Deak | .................... | H01R 12/714 439/91 |
| 5,129,833 A * | 7/1992 | Rowlette, Sr. | ....... | H05K 7/1061 439/91 |
| 5,215,472 A * | 6/1993 | DelPrete | ............. | H01R 12/714 439/71 |
| 5,473,510 A * | 12/1995 | Dozier, II | ......... | H01L 23/4006 439/91 |
| 5,706,952 A | 1/1998 | Bianca et al. | | |
| 6,068,174 A * | 5/2000 | Ball | ....................... | H01L 24/85 228/4.5 |
| 6,101,091 A * | 8/2000 | Baik | .................. | H01L 23/4093 257/727 |
| 6,185,816 B1 | 2/2001 | Freund et al. | | |
| 6,279,815 B1 | 8/2001 | Correia et al. | | |
| 6,514,097 B1 * | 2/2003 | Conroy | ................ | G01R 1/0466 439/330 |
| 6,565,706 B2 | 5/2003 | Moriuchi | | |
| 7,034,401 B2 | 4/2006 | Savastiouk et al. | | |
| 7,759,165 B1 | 7/2010 | Bajaj | | |
| 7,790,597 B2 | 9/2010 | Chauhan et al. | | |
| 7,969,013 B2 | 6/2011 | Chen et al. | | |
| 8,939,784 B2 * | 1/2015 | Lee | ......................... | H01R 12/00 439/314 |
| 9,209,608 B2 * | 12/2015 | Deshpande | .......... | H01R 9/2616 |
| 9,462,673 B2 * | 10/2016 | Zhang | .................. | H05K 1/0203 |
| 2002/0030972 A1 * | 3/2002 | Ali | ....................... | F28D 15/0233 257/E23.084 |
| 2003/0231481 A1 * | 12/2003 | Combs | ................. | H05K 3/3415 361/825 |
| 2004/0154529 A1 | 8/2004 | Nogiwa et al. | | |
| 2004/0257770 A1 * | 12/2004 | Hu | ...................... | H01L 23/4093 257/E23.099 |
| 2005/0045914 A1 | 3/2005 | Agranat et al. | | |
| 2006/0040521 A1 | 2/2006 | Gordon et al. | | |
| 2006/0156540 A1 * | 7/2006 | Cromwell | .............. | H05K 3/303 29/832 |
| 2007/0057681 A1 * | 3/2007 | Chang | .................. | G01R 1/0466 324/750.21 |
| 2007/0065534 A1 * | 3/2007 | Tsuji | ................... | B29C 45/6728 425/150 |
| 2007/0181644 A1 | 8/2007 | Ueno et al. | | |
| 2008/0160131 A1 * | 7/2008 | Sasaki | ................. | B29C 45/6728 425/589 |
| 2009/0056111 A1 | 3/2009 | Muren | | |
| 2009/0064489 A1 | 3/2009 | Inoue et al. | | |
| 2009/0147171 A1 * | 6/2009 | Yang | ................. | G02F 1/133308 445/24 |
| 2009/0320280 A1 * | 12/2009 | Chan | .................... | H05K 7/1007 29/748 |
| 2009/0321948 A1 | 12/2009 | Wang et al. | | |
| 2011/0092030 A1 | 4/2011 | Zvi et al. | | |
| 2011/0096514 A1 | 4/2011 | Hamilton et al. | | |
| 2012/0012645 A1 | 1/2012 | Motomura et al. | | |
| 2012/0070939 A1 | 3/2012 | Dunne et al. | | |
| 2012/0229999 A1 * | 9/2012 | Hussain | ............. | G01R 31/2886 361/783 |
| 2013/0263444 A1 * | 10/2013 | Lo | ............................ | B25B 9/00 81/487 |
| 2014/0239569 A1 * | 8/2014 | Merte | ................ | H01L 21/68778 29/559 |
| 2014/0359996 A1 * | 12/2014 | Allard | ..................... | H01L 23/36 269/254 R |
| 2014/0361477 A1 * | 12/2014 | Zhu | ........................ | B23Q 3/062 269/32 |
| 2015/0228529 A1 * | 8/2015 | Afable | ..................... | H01L 24/75 29/559 |
| 2015/0360273 A1 * | 12/2015 | Lin | ........................ | B21D 24/04 72/311 |
| 2016/0031138 A1 * | 2/2016 | Murata | ................ | B29C 45/1744 425/451.9 |
| 2017/0080621 A1 * | 3/2017 | Kikumori | ........... | B29C 45/7653 |

FOREIGN PATENT DOCUMENTS

| | | |
|---|---|---|
| JP | H07297595 A | 11/1995 |
| JP | H1064300 A | 3/1998 |
| JP | H1117397 A | 1/1999 |
| JP | H11260859 A | 9/1999 |
| JP | 2001179671 A | 7/2001 |
| JP | 2006253249 A | 9/2006 |
| JP | 2010232414 A | 10/2010 |
| JP | 2010272650 A | 12/2010 |
| SG | 11201500364 T | 4/2015 |

* cited by examiner

FIXTURE TO HOLD PART BEFORE AND AFTER REFLOW, AND METHOD

RELATED APPLICATIONS

This application claims priority to International Patent Application No. PCT/US2018/58627, filed Nov. 1, 2018, entitled "Fixture to Hold Part Before and After Reflow, and Method," which claims priority to U.S. Provisional Application No. 62/580,533 filed Nov. 2, 2017 entitled "Fixture to Hold Part Before and After Reflow, and Method," the disclosures of which is hereby incorporated by reference to the extent that they are not inconsistent with the present disclosure.

TECHNICAL FIELD

The subject matter herein relates to automated electronics assembly. More specifically, the subject matter relates to automated electronics assembly that maintains the position and form of parts during pick and place production/assembly.

BACKGROUND

Pick and place machines are used to assemble products such as in general electronics assembly, for example, by picking and placing components such as parts onto work objects such as substrates or printed circuit boards (PCBs). Automated electronic assembly may be used. As an example, a surface Mount Technology (SMT) machine is a type of high speed and high precision pick and place machine or process that is used to place surface-mount devices onto PCB's. In SMT processes, parts may be soldered onto substrates in a solder reflow process such as a hot oven reflow process. For example, solder paste may be applied by screen printing. As another example, solder may be applied to a solder attachment of a part, or to bonding points of a part prior to the assembly process. Parts provided with solder are referred to as "pre bumped with solder." As another example, a localized laser reflow process may be used. Flux may be later applied during the pick and place process. Prior to the solder reflow processes, the placed part(s) and the substrate may be clamped by a fixture to ensure the part(s) and the substrate are positioned properly during the solder reflow process, and to ensure the part(s) do not become deformed. For example, the fixture may be relatively large and heavy and may be manually secured to a substrate and a carrier to provide a constraining clamp force. In order to clamp the part(s) to the substrate, the substrate may need to be removed from the automated line. Once clamped, the fixture, part(s), substrate, and carrier, may then be put through the solder reflow process.

A novel approach that does not require manual clamping and/or removal of the substrate from the automated line would be well received in the art.

SUMMARY

A first aspect relates to a retaining clamp for use in a pick and place assembly process, comprising: a fixture; and a carrier; wherein the fixture comprises at least one retaining feature configured to releasably secure to the carrier such that a part and a work object are clamped together between the fixture and the carrier.

A second aspect relates to a method of clamping a part to a work object, comprising providing a fixture having a retaining feature; providing a part; providing a work object on a carrier; placing the part in between the fixture and the work object on the carrier; securing the retaining feature to the carrier such that the part and the substrate are clamped together between the fixture and the carrier.

A third aspect relates to a fixture for use in a pick and place assembly process comprising at least one retaining feature configured to releasably secure to a carrier such that a part and a work object are clamped together between the fixture and the carrier.

BRIEF DESCRIPTION OF THE DRAWINGS

Some of the embodiments will be described in detail with references made to the following figures, wherein like designations denote like members, wherein.

DETAILED DESCRIPTION

A detailed description of the hereinafter-described embodiments of the disclosed apparatus and method are presented herein by way of exemplification and not limitation with reference made to the Figures. Although certain embodiments are shown and described in detail, it should be understood that various changes and modifications might be made without departing from the scope of the appended claims. The scope of the present disclosure will in no way be limited to the number of constituting components, the materials thereof, the shapes thereof, colors thereof, the relative arrangement thereof, etc., and are disclosed simply as an example of embodiments of the present disclosure. A more complete understanding of the present embodiments and advantages thereof may be acquired by referring to the following description taken in conjunction with the accompanying drawings, in which like reference numbers indicate like features.

Figure 1:
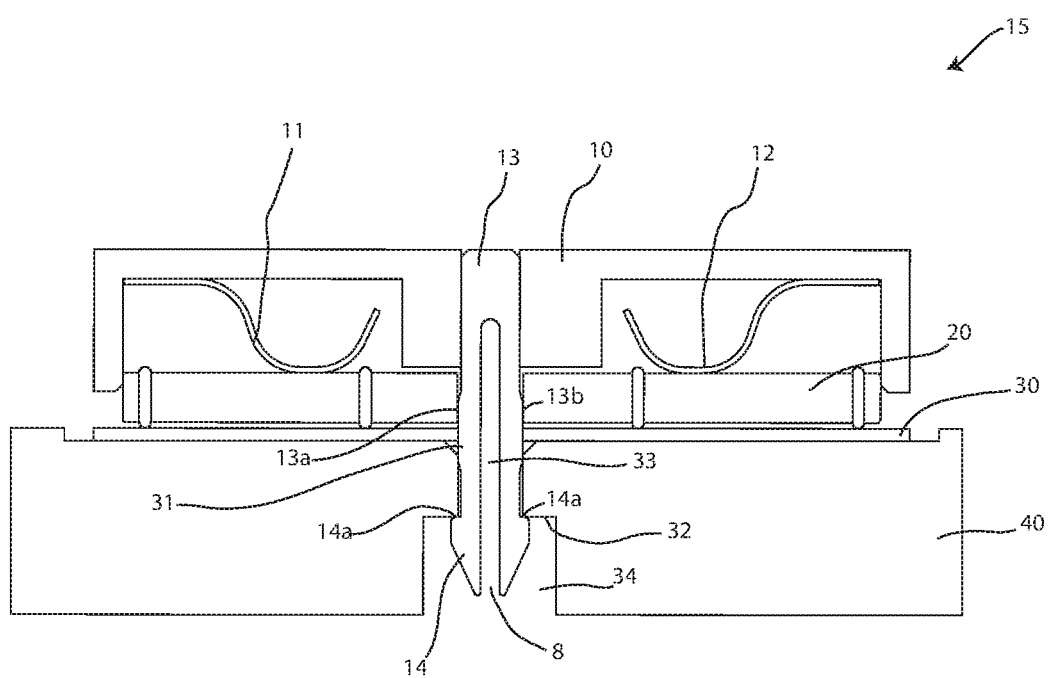
FIG. 1 is a side cross section view of an embodiment of a retaining clamp.

Referring to FIG. 1, a side cross section view of an embodiment of a clamping assembly 15 is shown clamping a part 20 to a work object 30, such as a substrate. A substrate may be a PCB, a chip, a system in package, a cable such as a flex circuit, and the like. In this embodiment, the work object 30 is a PCB 30. The clamping assembly 15 includes a fixture 10 and a carrier 40. The fixture 10 includes a fixture body and a retaining feature configured to releasably secure to a carrier 40. In the embodiment shown, the retaining feature is a snap fit feature including a protrusion that extends from the fixture body, wherein the protrusion is configured to be inserted into and releasably secure to the carrier. The protrusion may be an alignment pin 13 extending from the fixture body of the fixture 10. The alignment pin 13 has a bayonet tip 14 at the tip of the alignment pin 13. The bayonet tip 14 has a barb shelf 14a. Extending down a center region of the alignment pin 13 and bayonet tip 14 is an opening 8 configured such that the alignment pin 13 and bayonet tip 14 are compressible inward toward the opening 8. The opening 8 may extend down a length of the alignment pin 13 into the bayonet tip 14. The opening 8 is not limited to extending down a center region of the alignment pin 13 and bayonet tip 14. The alignment pin 13 has a first wide portion 13a and a second wide portion 13b on either side of the opening 8.

The carrier 40 includes an entrance 33 having a first end 31 and a second end 32. At the second end 32, the entrance 33 leads into a cavity 34. The cavity 34 is shown extending from the second end 32 to the bottom of the carrier 40. In another embodiment, the carrier 40 may have a continuous bottom surface such that the cavity 34 is partially enclosed by the continuous bottom surface. In this embodiment, the width of the cavity 34 is greater than the width of the entrance 33. In some embodiments, the entrance 33 and/or the cavity 34 may have a lining such as metal or rubber that guards against damage caused by friction as the alignment pin 13 and bayonet tip 14 are inserted into the entrance 33 and cavity 34. The entrance 33 may have a width that is less than a widest portion of the bayonet tip 14.

The alignment pin 13 is shown extending down through the entrance 33, and the bayonet tip 14 is shown having been inserted into the cavity 34, with the barb shelf 14a abutting the second end 32 of the entrance 33. The alignment pin 13 and bayonet tip 14 may be forcibly inserted into the first end 31 of the entrance 33 and the bayonet tip 14 may be pressed down the entrance 33 such that the bayonet tip 14 enters the cavity 34 and the bayonet tip 14 abuts and is secured to the carrier 40 by the second end 32. As the alignment pin 13 and bayonet tip 14 are inserted into the entrance 33, the opening 8 permits the alignment pin 13 and bayonet tip 14 to be compressed inwards into the opening 8 such that the alignment pin 13 and bayonet tip 14 are in a compressed position and can be inserted into the entrance 33 and the bayonet tip 14 can be inserted into the cavity 34. Once the bayonet tip 14 has entered the cavity 14, the alignment pin 13 and bayonet tip 14 may expand into a non-compressed position such that the barb shelf 14a abuts the second end 32 of the entrance 33 and secures the fixture 10 to the carrier 40, thereby forming the clamping assembly 15. The entrance 33 is not limited to being an equal width from the first end 31 to the second end 32. In another embodiment, the entrance 33 may include one or more lips and the alignment pin 13 may include one or more narrow portions 16 (shown in FIGS. 6A-6C and discussed hereinafter) along the length of the alignment pin 13 configured to catch the one or more lips as the alignment pin 13 is pressed into the entrance 33.

The bayonet 14 may be made of a material with an elastic bias such as metal, plastic, or rubber such that the bayonet 14 can be pressed into a space that has a width that is less than the widest portion of the bayonet 14. In another embodiment, the alignment pin 13 and bayonet tip 14 may not have an opening 8, and may be forcibly inserted into the entrance 33 and cavity 34 by an elastic bias of the alignment pin 13 and bayonet tip 14 material. The alignment pin 13 may have a tip that is a different shape or configuration from the bayonet tip 14, for example, the alignment tip 13 may have a sphere-shaped tip. A retaining feature may also be a magnet (shown in FIG. 2 and discussed hereinafter), a releasable tacky substrate, and the like.

The fixture 10 and the carrier 40 provide a clamping force on the part 20 and PCB 30 that holds the part 20 and the PCB 30 in a desired position, for example, during a reflow process such as a hot oven solder reflow process or a localized laser reflow process. In some instances, a part such as part 20 may have deformations, damage, warping, and the like, such as in thin cross sections of the part. Deformations, damage, warping and the like may be caused when the part is not constrained by an object such as a storage tray or packaging. This may prevent the part from properly aligning with a work object such as PCB 30. For example, a part and work object may have corresponding solder attachment or bonding points that must align for proper attachment of the part to the work object. Deformations, warping, or damage of a part may prevent such solder attachment or bonding points from properly aligning with the corresponding solder attachment or bonding points of the work object. The effects of damage, deformations, and warping may be prevented by the clamping force provided by the clamping assembly 15, which may ensure that all solder attachment or bonding points are held in contact with corresponding solder attachment or bonding points of the work object. This contact may be maintained by the clamping assembly 15 throughout a reflow process.

The fixture 10 may be made of a rigid material. The fixture 10 may be reusable, or disposable. For example, the fixture 10 may be made of a durable material, such as steel, aluminum, and the like, and may be reused in the assembly and reflow processes more than once. As another example, the fixture may be formed as a plastic injection molded part or other low-cost molded material and may be discarded after an assembly and reflow process is completed. The alignment pin 13 may be formed of the same material as the fixture 10. The alignment pin 13 and the fixture 10 may be a single continuous piece of material. The alignment pin 13 may be removeably attachable to the fixture 10. The bayonet tip 14 may be releasably attached to the alignment pin 13. For example, the bayonet tip 14 may be attached to the alignment pin 13 before the alignment pin 13 is secured to the carrier 40. In some embodiments, the snap fit features of the fixture 10 may be disposable such that after each use, new snap fit features such as one or more alignment pins 13 with one or more bayonet tips 14 may be attached to the fixture 10.

In the embodiment shown in FIG. 1, the alignment pin 13 extends through the part 20 and the PCB 30. The part 20 and the PCB 30 each have a retaining feature opening 71, 72 (shown in FIGS. 5, 10-12, and 15 and discussed hereinafter) through which the alignment pin 13 and the bayonet tip 14 can be inserted. A retaining feature opening 71, 72 may be a hole, a bore, a slot, an aperture, and the like. The alignment pin 13, inserted into the retaining feature opening 71 of the part 20, and the retaining feature opening 72 of the PCB 30, keep the part 20 and the PCB 30 aligned and in the correct position with respect to one another between the carrier 40 and the fixture 10 during, for example, a reflow process. The first wide portion 13a and the second wide portion 13b may provide a friction fit between the alignment pin 13 and the retaining feature openings 71, 72 of the part 20 and the PCB 30. This friction fit may help the fixture 10 pick up the part 20 and the PCB 30 on the carrier 40. As an example, the retaining feature openings 71, 72 may be a pre-formed hole. The retaining feature openings 71, 72 may be a perforated hole which may be punctured by the alignment pin 13 or bayonet tip 14 when the alignment pin 13 or bayonet tip 14 is pressed through the retaining feature openings 71 of the part and the retaining feature opening 72 of the PCB 30.

The fixture 10 may have one or more clamping force features that provide a vertical force on the part 20 and the PCB 30 while the part 20 and PCB 30 are clamped in between the carrier 40 and the fixture 10. In such an embodiment, the barb shelf 14a of the bayonet tip 14 abutting the second end 32 of the entrance 33 resists the vertical force of the one or more clamping force features thereby clamping the part 20 and PCB 30 in the desired position. The clamping force features may be leaf springs, coiled springs, and the like. As another example, a clamping force feature may be provided by an elastic medium included in the fixture 10, such as foam that has an expanding force when compressed. As an additional example, a clamping force feature may be the mass of the fixture 10 providing a vertical force to the part 20 and PCB 30. A clamping force feature may extend from a fixture body of the fixture 10. In another embodiment, the clamping force feature may extend from the carrier 40. With continuing reference to the embodiment shown in FIG. 1, the fixture 10 has a first spring feature 11 and a second spring feature 12. Each of the first and second spring features 11, 12 are shown extending down from the fixture 10 on either side of the alignment pin 13 such that the first and second spring features 11, 12 apply a vertical spring force on the part 20 and the PCB 30 between the fixture 10 and the carrier 40. The first and second spring features 11, 12 may be removable. For example, the fixture 10 may have one or more clamping force feature attachment locations. Clamping force feature locations may be slots, screw openings, holes, and the like. As one example, depending on the type of part 20 and PCB 30 to be clamped, different clamping force features may be desired. Different clamping force features may apply different measures of force. Different clamping force features may be attachable to the fixture 10 at the clamping force feature attachment locations. Clamping force features may include coiled springs 61 (shown in FIG. 3 and discussed hereinafter). In other embodiments, more than two spring features may extend from the fixture 10 in a circle around a single alignment pin such as alignment pin 13. As another example, the fixture 10 may have more than one alignment pin 13 and more than two spring features. In yet another embodiment, the carrier 40 may have one or more clamping force features that provide a vertical force, for example, a vertical spring force, on the part 20 and the PCB 30 while the part 20 and PCB 30 are clamped in between the carrier 40 and the fixture 10. Each of the fixture 10 and the carrier 40 may have one or more clamping force features. In another embodiment, the fixture 10 may not have any clamping force features and may secured to the carrier 40 only by a snap fit feature and direct contact between the fixture 10 and the part 20. In yet another embodiment, a snap fit feature may have a spring feature. For example, the alignment pin 13 may be spring loaded or have an accordion shaped portion configured to compress when fixture 10 is secured to the carrier thereby providing a vertical spring force to the part 20 and the PCB 30 clamped between the part 20 and the PCB 30.

Further, the snap fit feature is not limited to being an alignment pin 13. For example, the clamping assembly 15 may be an alignment ridge. As an example, the fixture 10 may have an alignment ridge extending parallel along each of two opposite bottom edges of the fixture 10. Each alignment ridge may have an L-shaped bracket at the end configured to snap over opposite edges of the carrier 40. For example, the carrier 40 may have an indentation along each of two opposite sides of the carrier 40 configured to receive the L-shaped brackets such that the fixture 10 is secured to the carrier 40 to clamp a part 20 and PCB 30 together. As another example, the L-shaped brackets may snap over the bottom side edges of the carrier 40. As another example, the clamping assembly 15 is not limited to having one type of snap fit feature and may include one or more different snap fit features, for example, one or more alignment pins 13 and one or more alignment ridges.

Figure 2:
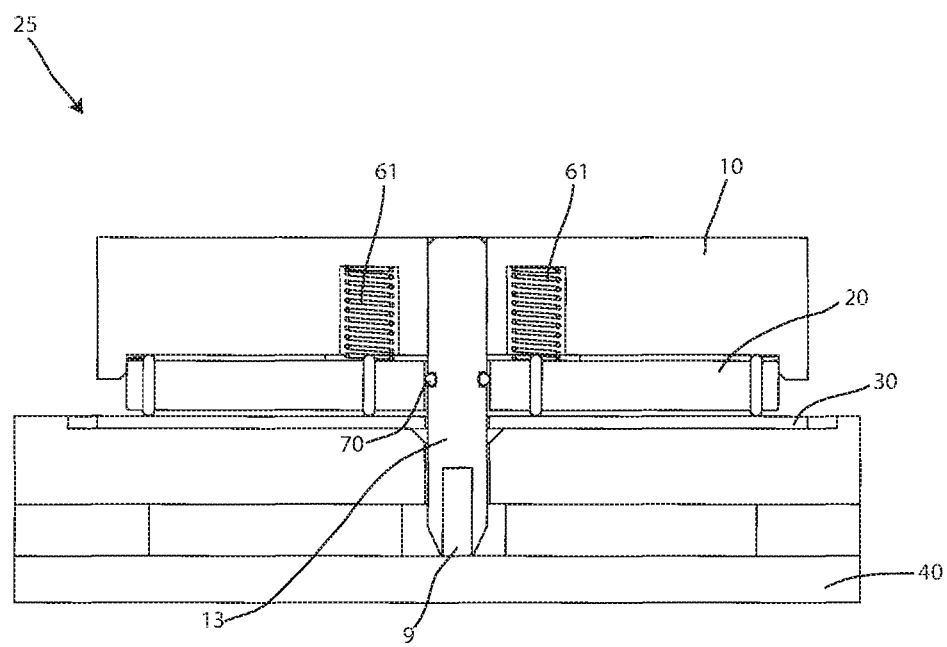
FIG. 2 is a side cross section view of another embodiment of a retaining clamp.

Referring to FIG. 2, a side cross section view of another embodiment of a clamping assembly 25 clamping a part 20 to a PCB 30 is shown. The clamping assembly 25 includes a fixture 10 and a carrier 40. The fixture has an alignment pin 13. In this embodiment, the alignment pin 13 has a retaining feature that includes a magnet tip 9. The carrier 40 may be made of a material or may include a layer or portion of material that will secure to the magnet tip 9. The magnetic force between the carrier 40 and the magnet tip 9 is configured to maintain the attachment of the carrier 40 to the magnet pin 9 and resist the vertical force of any clamping force features of the clamping assembly 25. In this embodiment, the fixture 10 includes clamping force features that are coiled springs 61 that provide a vertical spring force upon the part 20 and the PCB 30. The alignment pin 13 includes an O-ring 70 located around the alignment pin 13 such that the O-ring 70 provides a friction force between the alignment pin 13 and the retaining feature openings 71, 72 of the part 20 and the PCB 30. The alignment pin 13 may include an O-ring 70 in place of a first wide portion 13a and a second wide portion 13b. In another embodiment, the alignment pin 13 may include a first wide portion 13a, a second wide portion 13b, and one or more O-rings 70.

In another embodiment, the carrier 40 may include a magnetic protrusion and the alignment pin 13 may include an opening at the tip configured to receive the magnetic protrusion. The alignment pin 13 may be entirely made of a magnetic material, or may include a magnetic layer or portion that the tip such that the magnetic force between the magnetic protrusion and the alignment pin is configured to maintain the attachment of the carrier 40 to the fixture 10 and resist the vertical force of any clamping force features. Further, in other embodiments, the retaining feature may be a releasable tacky substrate, for example, a releasable tacky substrate layer disposed on the carrier 40 that is configured to attach to the tip of an alignment pin 13. The retaining feature may be selected based on the reflow process to be used. For example, the magnet pin 9 may be used with a localized laser reflow process, and snap fit features may be used with a hot oven reflow process.

An alignment pin 13 of a clamping assembly 15, 25 is not limited to extending from a middle portion of the fixture 10 as shown in FIGS. 1 and 2. As an example, the fixture 10 may have two alignment pins 13 extending from opposite bottom edges of the fixture 10, and the carrier 40 may have two entrances 33 with cavities 34 configured to receive the two alignment pins 13. Further, the clamping assembly 15, 25 is not limited to clamping a single part 20 to a substrate such as PCB 30. For example, the clamping assembly 15, 25 may be used to clamp more than one part to a substrate.

The fixture 10 may have form constraining features that force a part such as part 20 into a desired shape or form, and/or maintain the desired shape or form of the part 20 when the part 20 is placed onto a substrate such as PCB 30. Form constraining features may include boss features, O-rings such as O-ring 70 located on the snap fit features, and clamping force features such as coil springs, and the like. For example, with reference to FIG. 3, a bottom view of an embodiment of fixture 10 is shown. In this embodiment, fixture 10 has a plurality of coil springs 61a-61h such that two springs are arranged with one each on either side of each corner of the fixture 10. In another embodiment, the coil springs may be arranged in a different configuration. The fixture 10 also has a plurality of boss features 60a-60h which are placed in between coil springs 61a and 61b; 61c and 61d; 61e and 61f; and 61g and 61h. The plurality of boss features 60a-60h may correspond to the shape and size of the part 20 to be clamped to a PCB 30. In this embodiment, the plurality of boss features 60a-60h is shown forming an outline of where a part 20 may be secured by the fixture 10. The plurality of boss features 60a-60h may abut the edges of a part 30 when the part 20 is clamped to a PCB 30 between the fixture 10 and the carrier 40. The plurality of boss features 60a-60h may further include boss features configured to contour to surface features of the part 20 to be clamped. The fixture 10 is shown having two alignment pins 13 with bayonet tips 14 arranged diagonally from each other. In other embodiments, the alignment pins 13 may have a different arrangement.

Figure 3:
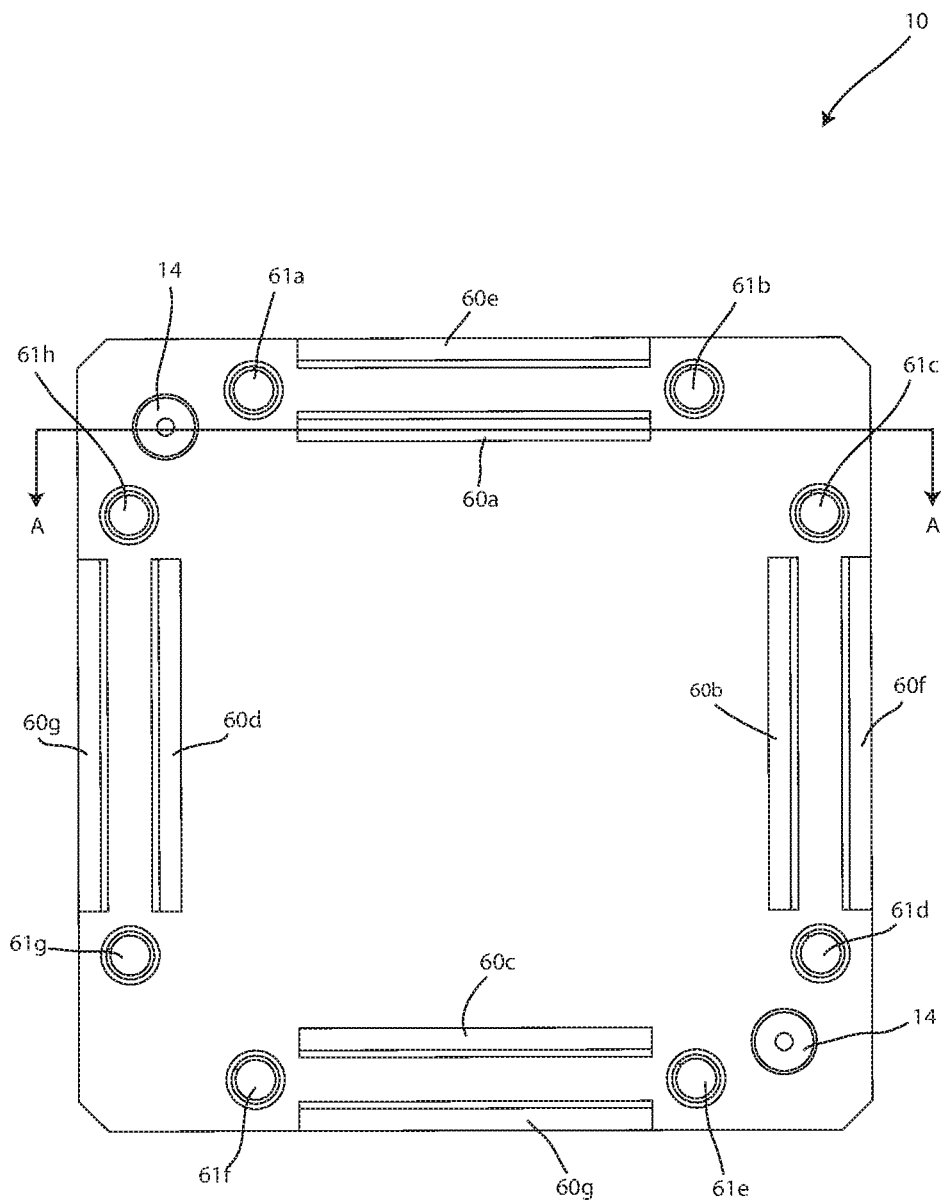
FIG. 3 is a bottom view of an embodiment of a fixture having boss features.
Figure 4:
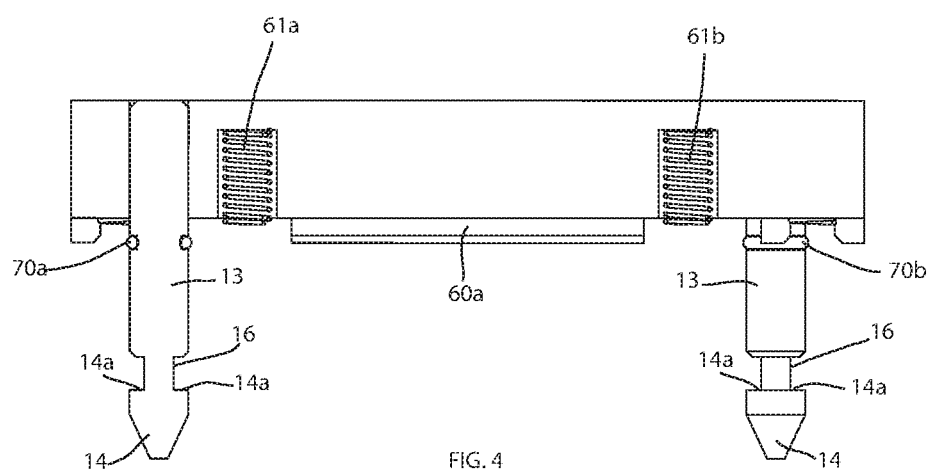
FIG. 4 is a side cross section view taken along line A-A of FIG. 3, of the embodiment of the fixture of FIG. 3 having O-rings.

As another example of form constraining features, one or more O-rings 70 may be located around the alignment pins 13. Referring to FIG. 4, a side cross section view of the fixture 10 taken along line P-P in FIG. 3 is shown. A first O-ring 70a is located around one of the alignment pins 13 and a second O-ring 70b is located around the other alignment pin 13 shown. The O-rings 70a, 70b may be configured to hold a part 20 in an un-deformed position when the part 20 and the PCB 30 are clamped between the fixture 10 and the carrier 40. The O-rings 70a, 70b may be made of a compliant material such as rubber, and the like. In another embodiment, a carrier 40 may include boss features configured to keep a substrate such as PCB 30 in a desired position with respect to the part 20 to be clamped to the PCB 30.

Figure 5:
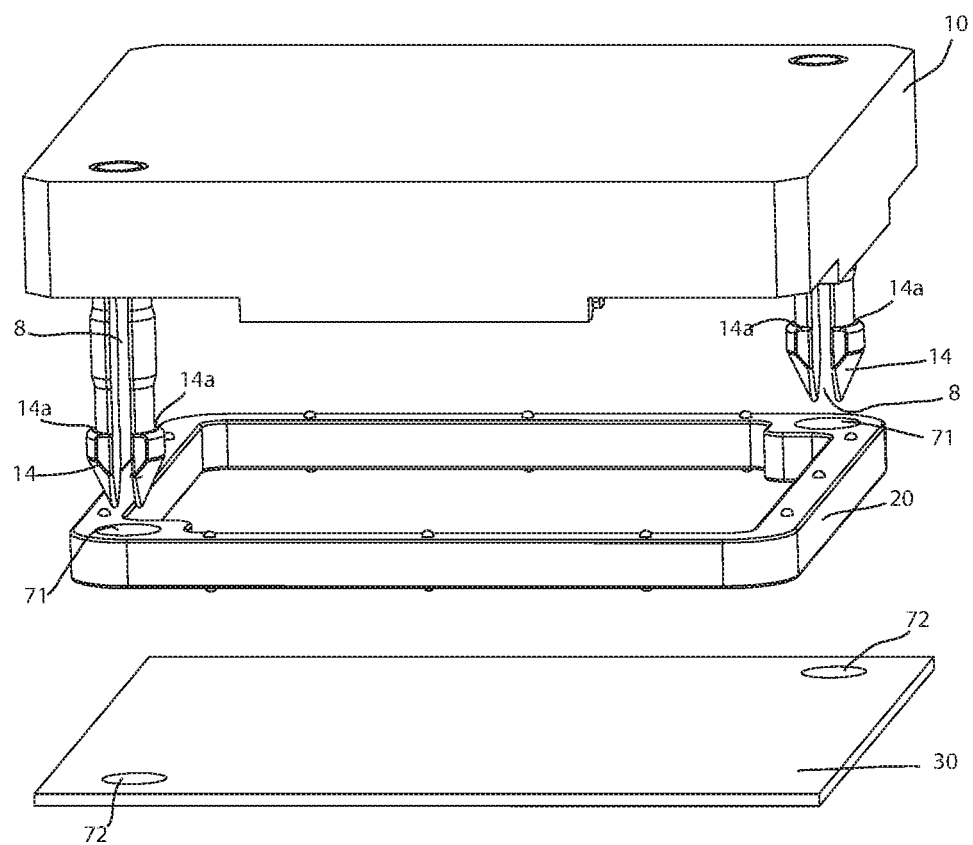
FIG. 5 is an exploded view of an embodiment of a retaining clamp, a part, and a substrate.

Referring to FIG. 5, an exploded view of an embodiment of a fixture 10 of a clamping assembly, a part 20 having a retaining feature opening 71 and PCB 30 having a retaining feature opening 72 is shown. The fixture 10 has an alignment pin 13 positioned to extend through the retaining feature openings 71, 72. The retaining feature openings 71, 72 may each be the same diameter to correspond to the alignment pin 13. The retaining feature openings 71, 72 may be arranged such that when the part 20 is positioned on the PCB 30 in the desired position and configuration, the retaining feature openings of the part 71 and the retaining feature openings 72 of the PCB 30 are aligned. The retaining feature openings 71, 72 of the part 20 and PCB 30 may be configured such that a part 20 may be placed on different sized substrates or in different configurations such that the retaining feature openings 71 of the part still align with retaining feature openings 72 of the carrier align. As an example, the retaining feature openings 71 of the part may have an elongated shape such as an oblong shape such that retaining feature openings 72 of a substrate such as PCB 30 are aligned underneath at least a portion of the oblong retaining feature openings 71 of the part.

Figure 6A:
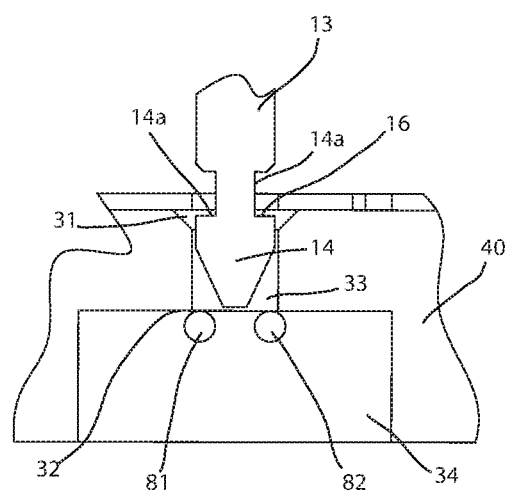
FIG. 6A is a side cross section view of an embodiment of a snap fit feature in a first position.
Figure 6B:
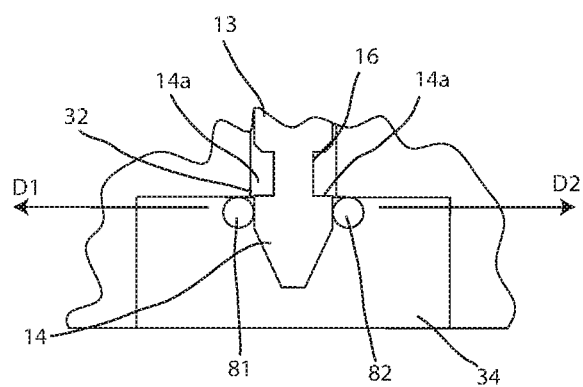
FIG. 6B is a side cross section view of the embodiment of the snap fit feature of FIG. 6A in a second position.
Figure 6C:
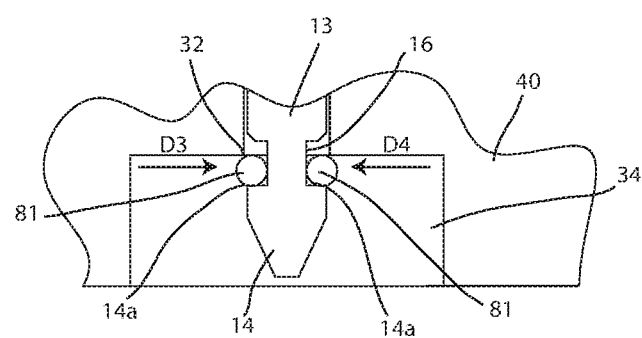
FIG. 6C is a side cross section view of the embodiment of the snap feature of FIG. 6A in a third position.

The clamping assembly 15, 25 may include additional features that secure the fixture 10 to the carrier 40. For example, the carrier 40 may have one or more wire beams that flex when the carrier 40 receives the retaining features of the fixture 10, and retract after the retaining features are received by the carrier 40 such that the one or more wire beams retract and secure the retaining features of the fixture 10. With reference to FIGS. 6A-6C, an embodiment of a carrier 40 is shown having flexible wire beams 81, 82 configured to secure the fixture 10 to the carrier 40. Referring now to FIG. 6A, a side cross section view of a carrier 40 is shown with a first wire beam 81 and a second wire beam 82 in an un-flexed position proximate to the second end 32 of the entrance 33 of the carrier 40. Also shown, an alignment pin 13 having a narrow portion 16 and a bayonet tip 14 is shown approaching the first end 31 of the entrance 33. The first and second wire beams 81, 82 may extend from one side of the carrier 40 to the opposite side of the carrier 40 such that the first and second wire beams 81, 82 partially intersect with a portion of a width of the entrance 33. The height of each of the first and second wire beams 81, 82 may be the same as the height of the narrow portion 16 of the alignment pin 13 such that the first and second wire beams 81, 82 are configured to securably engage with the narrow portion 16 of the alignment pin 13.

Referring to FIG. 6B, a side cross section view of the carrier 40 of FIG. 6A is shown with the first and second wire beams 81, 82 each in a flexed position. The alignment pin 13 is shown having been inserted into the entrance 33 and the bayonet tip 14 is shown entering the cavity 34 thereby forcing the first and second wire beams 81, 82 to flex away from each other. The first and second wire beams 81 and 82 are shown flexing in opposite directions D1, D2 away from the second end 32 of the entrance 33.

Referring to FIG. 6C, a side cross section view of the carrier 40 of FIG. 6A is shown with the first and second wire beams 81, 82 each having retracted in opposite directions D3, D4 and returned to an un-flexed position. The alignment pin 13 is shown having been inserted into the carrier 40 such that the bayonet tip 14 is in the cavity 34. The first and second wire beams 81, 82 are shown having returned to an un-flexed position against the narrow portion 16 of the alignment pin 13 such that the barb shelf 14a of the bayonet tip 14 is abutting and is secured by the first and second wire beams 81, 82. A clamping assembly 15, 25 may include one or more wire beams 81, 82. In embodiments in which a fixture 10 has more than one alignment pin 13 such as one alignment pin 13 proximate to each of two opposite bottom edges of the fixture 10, the corresponding carrier 40 may include an entrance 33 and cavity 34 for each of the alignment pins 13, and may have one or more wire beams corresponding to each entrance 33 configured to secure each alignment pin 13.

Figure 7:
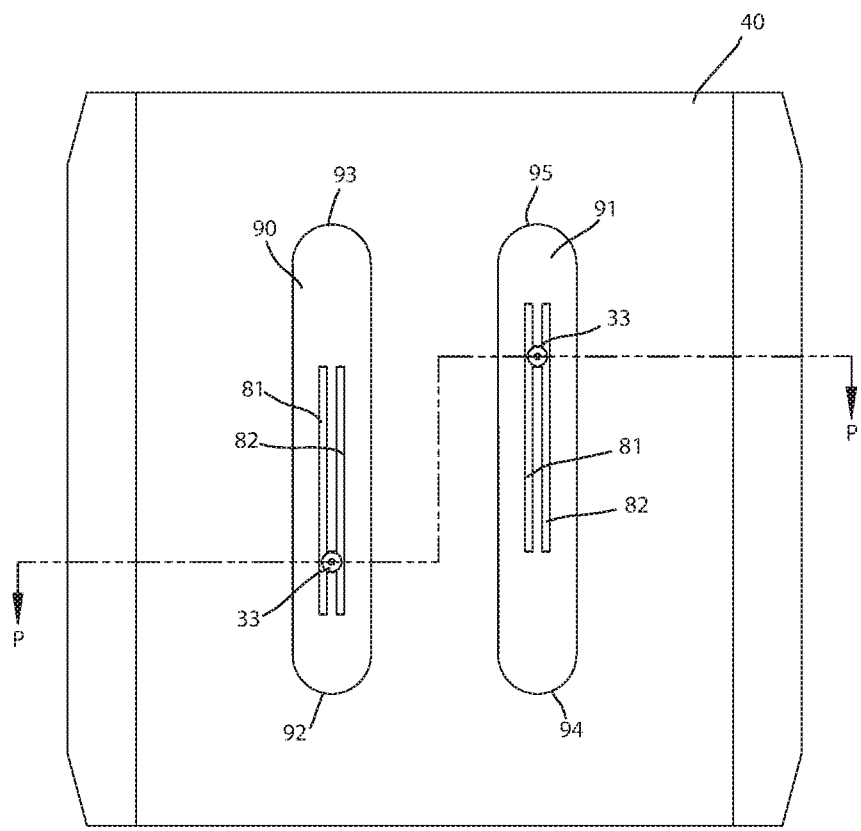
FIG. 7 is a bottom view of an embodiment of a carrier of a retaining clamp according to one embodiment.

Referring to FIG. 7, a bottom view of an embodiment of a carrier 40 including wire beams 81, 82 is shown. The carrier 40 has a first retaining feature location 90 and a second retaining feature location 91. The first and second retaining feature locations 90, 91 are each configured to receive a retaining feature, such as an alignment pin 13 of a fixture 10. Each of the first and second retaining feature locations 90, 91 includes an entrance 33, and a cavity 34. The cavity 34 of the first retaining feature location 90 extends from a first edge 92 of the first retaining feature location 90 to a second edge 93 of the first retaining feature location 90. Extending from the first edge 92 to the second edge 93 are a first and a second wire beam 81, 82 that are positioned such that the first and second wire beam 81, 82 partially intersect with a portion of a width of the entrance 33 of the first retaining feature location 90. Similarly, the cavity 34 of the second retaining feature location 91 extends from a first edge 94 of the first snap fit feature location 91 to a second edge 95 of the first snap fit feature location 90. Extending from the first edge 94 to the second edge 95 are a first and a second wire beam 81, 82 that are positioned such that the first and second wire beam 81, 82 partially intersect with a portion of a width of the entrance 33 of the second retaining feature location 91. Bayonet tips 14 are shown extending into the cavities 34 such that the bayonet tips 14 are secured by the first and second wire beams 81, 82.

Figure 8:
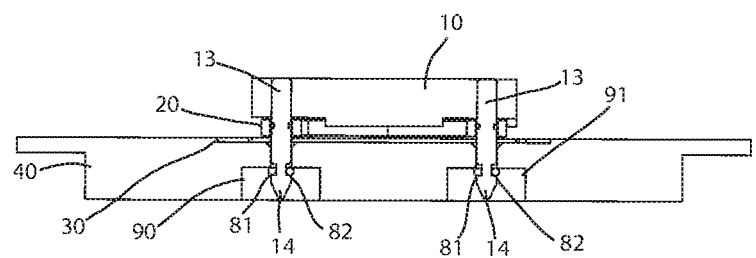
FIG. 8 is a side cross section view taken along line P-P of FIG. 7, of the embodiment of the carrier of FIG. 7.

Referring to FIG. 8, a side cross section view taken along line P-P in FIG. 7 of the first retaining feature location 90 and the second retaining feature location 91 is shown taken along line P-P in FIG. 7. The first and second wire beams 81, 82 of the first retaining feature location 90 and the first and second wire beams 81, 82 of the second retaining feature location 91 may be configured to flex and retract in the same manner as described with respect to FIGS. 6A-6C. In another embodiment, the carrier 40 may include wire beams 81, 82, and each entrance 33 may include one or more lips configured to securably engage with a narrow portion 16 of an alignment pin 13 such that the alignment pin 13 is secured by the lip and the wire beams 81, 82.

Figure 9:
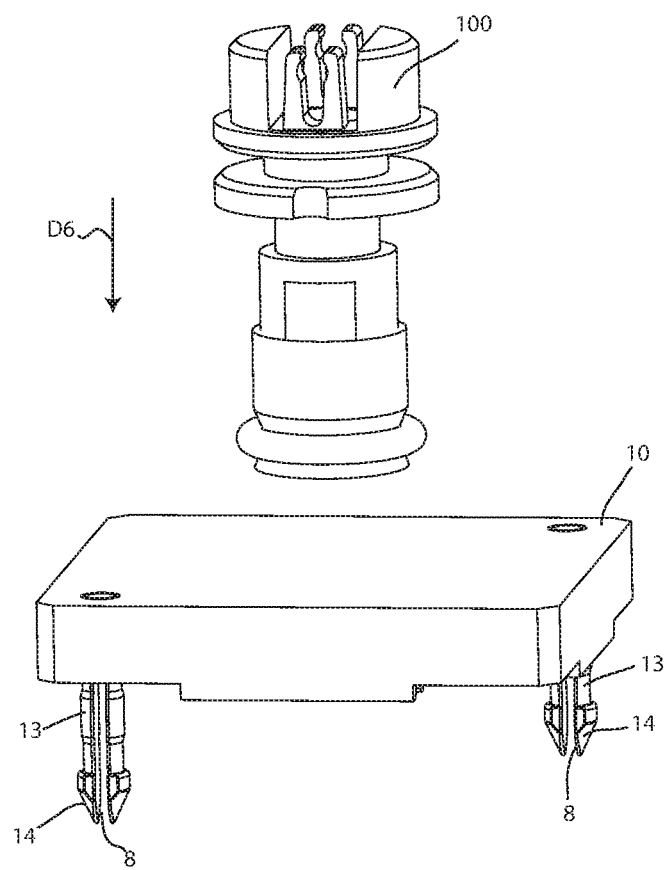
FIG. 9 is a side view of an embodiment of a nozzle picking up an embodiment of a fixture.
Figure 10:
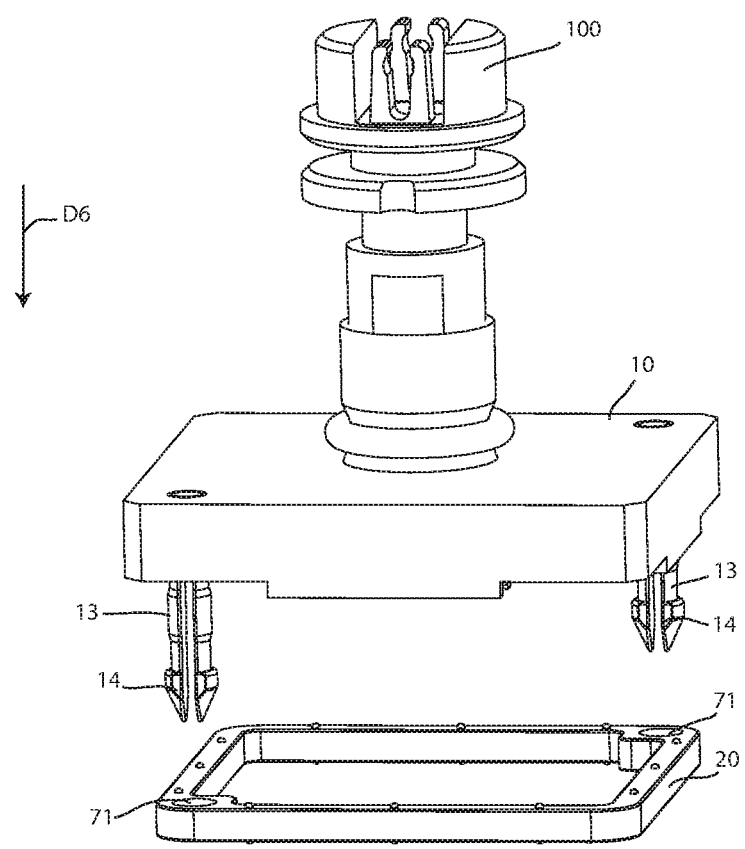
FIG. 10 is a side view of the nozzle of FIG. 9 having picked up the fixture, and approaching a part according to one embodiment.

Referring to FIGS. 9-15, a method of using an embodiment of a clamping assembly 35 (shown assembled in FIG. 13) is shown. The fixture 10, carrier 40, or both the fixture 10 and the carrier 40 may have features that allow pick and place equipment such as standard automated SMT pick and place equipment to be used to move and assemble the clamping assembly 35 (as shown for example in FIGS. 13 and 14) such that human intervention is not required to clamp a part to a substrate, and such that the clamping assembly 35, part, substrate, or carrier 40 do not need to be removed from the automated line to assemble the clamping assembly 35 such that the clamping assembly 35 is clamping a part and a substrate. Referring now to FIG. 9, a side view of a standard automated SMT pick and place machine is shown, for example, a standard vacuum nozzle of the pick and place machine such as nozzle 100. Nozzle 100 is shown positioned to pick up a fixture 10 The nozzle 100 is moving down in direction D6 towards the fixture 10. The fixture 10 may be configured to be picked up by the nozzle 100 from a top surface of the fixture 10. In FIG. 10, a side view of the nozzle 100 having picked up the fixture 10 and approaching a part 20 in direction D6 is shown. The part 20 may be secured to the fixture 10 by means of a first and second wide portion 13a, 13b of the alignment pins 13. In another embodiment, the alignment pins 13 may further include O-rings, or one of O-rings and wide portions 13a, 13b. The nozzle 100 may orient and/or position the fixture 10 above a part 20. For example, the nozzle 100 may orient and or position the fixture 10 above the part 20 such that boss features such as boss features 60a-60h on the fixture 10 engage and secure the part 20 in a desired position when the part 20 is picked up. As another example, the nozzle may orient and/or position the fixture 10 above the part 20 such that alignment pins 13 of the fixture 10 are oriented directly above corresponding retaining feature openings 71 of the part 20 such that the alignment pins 13 are inserted through the retaining feature openings 71 of the part 20 when the part 20 is picked up.

Figure 11:
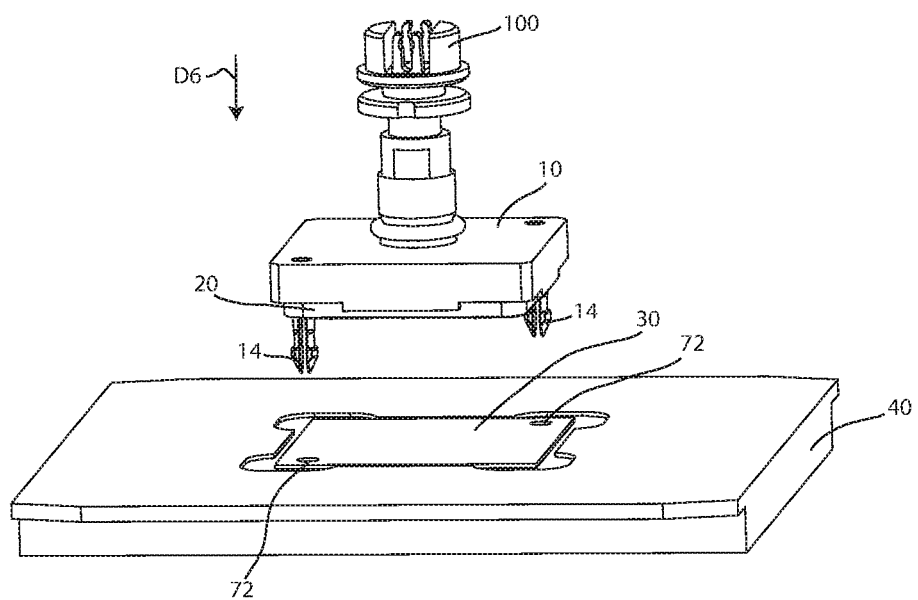
FIG. 11 is a side view of the nozzle of FIG. 9, the fixture of FIG. 9, and the part of FIG. 10, the fixture having picked up the part.
Figure 12:
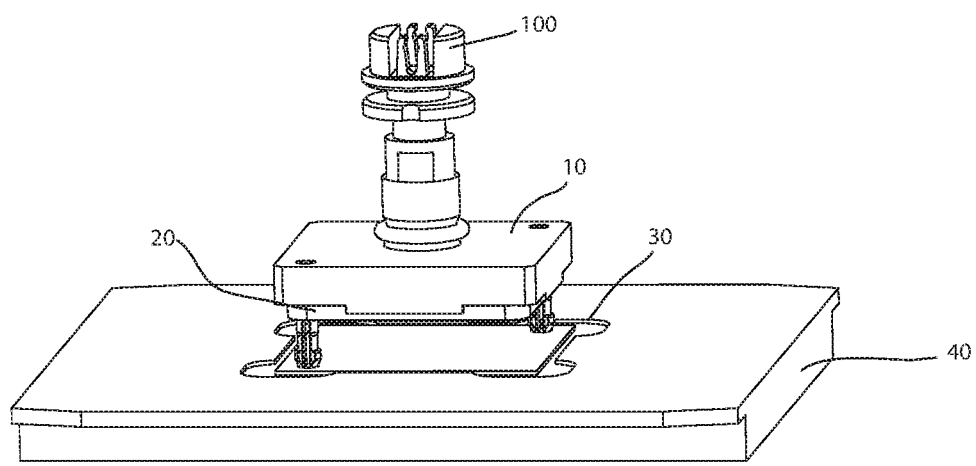
FIG. 12 is a side view of the nozzle of FIG. 9, the fixture of FIG. 9, and the part of FIG. 10, approaching a substrate on a carrier according to one embodiment.

With reference to FIG. 11, the nozzle 100 is shown having picked up the fixture 10 and the part 20. The alignment pins 13 are shown having been inserted through retaining feature openings 71 of the part 20. Referring to FIG. 12, the nozzle 100 is further shown approaching a PCB 30 on a carrier 40 such that the alignment pins 13 are entering the retaining feature openings 72 of the PCB 30. The PCB 30 may be placed on the carrier 40 before the fixture 10 is moved by the nozzle 100 to pick up the part 20, such that the nozzle 100 can position the fixture 10 over the PCB 30 and carrier 40 at the same time and align the PCB 30 and carrier 40 by securing the alignment pins 13 to the carrier 40. The nozzle 100 may move the fixture 10 and part 20 down in direction D6 such that the alignment pins 13 are inserted into the retaining feature openings 72 of the PCB 30 and the bayonet tips 14 are pressed through entrances 33 and into corresponding cavities 34 of the carrier 40 such that the fixture 10 is secured to the carrier 40 and is providing a clamping force on the part 20 and the PCB 30.

Figure 13:
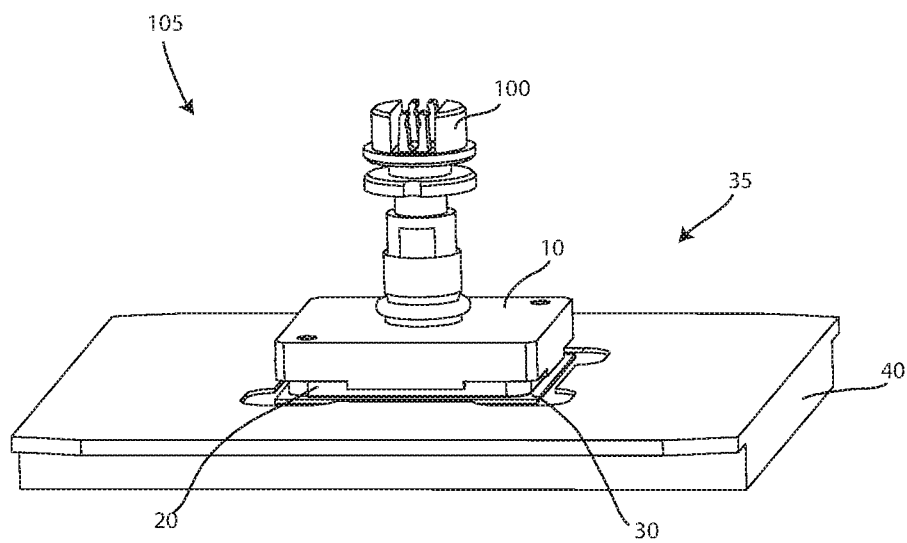
FIG. 13 is a side view of the nozzle of FIG. 9, the fixture of FIG. 9, the part of FIG. 10, and the substrate and carrier of FIG. 12, the fixture clamping the part and the substrate to the carrier.

Wet solder paste may applied to the part 20 or the PCB 30 before the part 20 is placed onto the PCB 30. The fixture 10 may thereby ensure solder attachment or bonding points of the part 20 are aligned with solder attachment or bonding points of the PCB 30, and that the wet solder paste is properly placed in the desired location and configuration. With reference to FIG. 13, a side view of the fixture 10 and carrier 40 secured to form a clamping assembly 35 is shown. The clamping assembly 35 thereby clamps the part 20 and PCB 30 together in the desired position. The clamping assembly 35 may be used to keep the part 20 and the PCB 30 clamped together in the desired position before, during, and after a hot oven, localized laser, or other reflow process.

Figure 14:
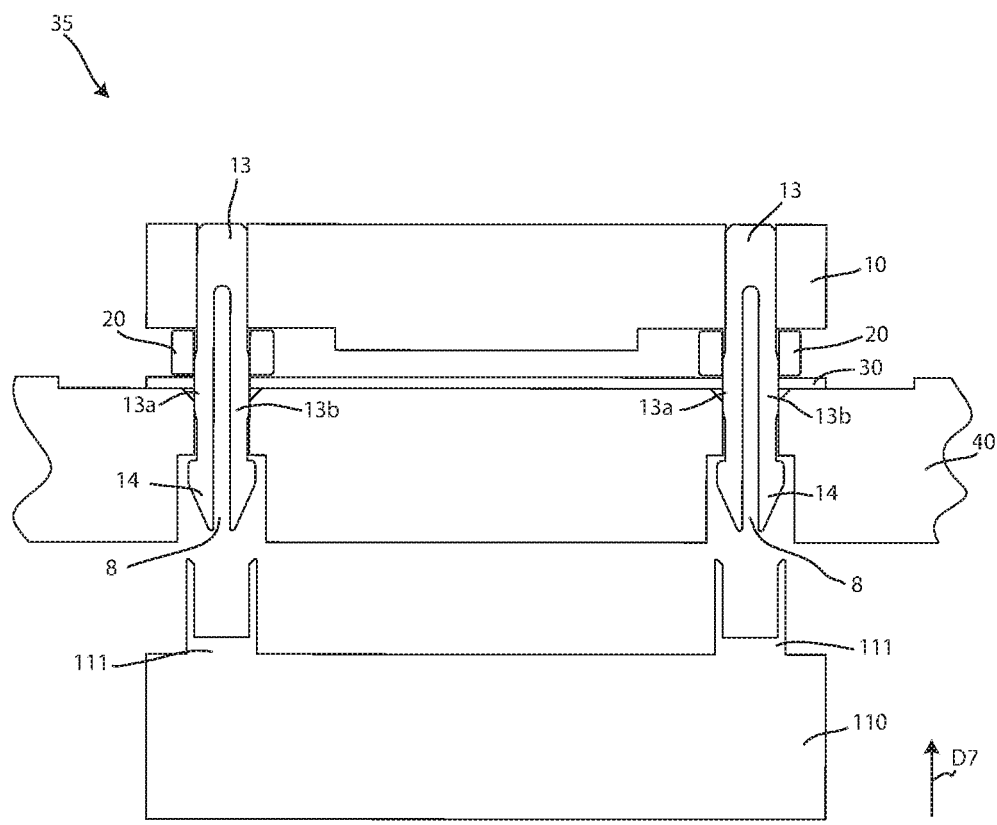
FIG. 14 is a side cross section view of the nozzle of FIG. 9, the fixture of FIG. 9, the part of FIG. 10, and the substrate and carrier of FIG. 12, and a fixture stripper according to one embodiment.

After the reflow process is completed, the clamping assembly 35 may be removed. This may be accomplished by unsnapping the snap fit feature of the clamping assembly 35. For example, a fixture stripper may be used to compress the bayonet tips 14 of the alignment pins 13 such that the bayonet tips 14 and alignment pins 13 can be lifted out of the entrances 33 of the carrier 40. With reference to FIG. 14, a side cross section view of the nozzle 100 and clamping assembly 35 is shown. The nozzle 100 is positioned to lift the fixture 10 such that the alignment pins 13 are removed from the carrier 14. Also shown is a fixture stripper 110 positioned below the carrier 40. The fixture stripper 110 has fixture removers 111 that are configured to at least partially surround the bayonet tips 14 such that the bayonet tips 14 are compressed inwards into the openings 8 such that the barb shelves 14a are no longer abutting the second ends 32 of the entrances 33 of the carrier 40. While the bayonet tips 14 are compressed, the fixture 10 can be lifted by the nozzle 100 such that the alignment pins 13 are lifted out of the entrances 33 of the carrier 40 and the fixture 10 is removed. As another example, a nozzle such as nozzle 100 may pull the fixture 10 in an upwards direction such that the fixture 10 is no longer secured to the carrier 40. For example, in an embodiment in which the alignment pins 13 do not have an opening 8, and the bayonet tips 14 are made of an elastic material, the nozzle 100 may pull the fixture 10 from the carrier 40 such that the bayonet tips 14 are forced out of the cavity 34 up through the second end 32 and first end 31 of the entrance 33 and out of the carrier 40.

In another embodiment, the fixture stripper may be configured to connect to and remove the bayonet tips 14 or any other removable tip of the alignment pins 13. The bayonet tips 14 may be stripped from the alignment pins 13 by cutting, slicing, sanding, filing, shredding, pulling, and the like. The fixture stripper 110 may be configured to perform multiple stripping methods such as cutting, slicing, sanding, filing, shredding, pulling, and the like. The bayonet tips 14 may also be removeably screwed onto the alignment pins 13 in which case the fixture stripper 110 may be configured to unscrew the bayonet tips 14 from the alignment pins. The bayonet tips 14 may be disposed of after removal, or may be stored for reuse.

Figure 15:
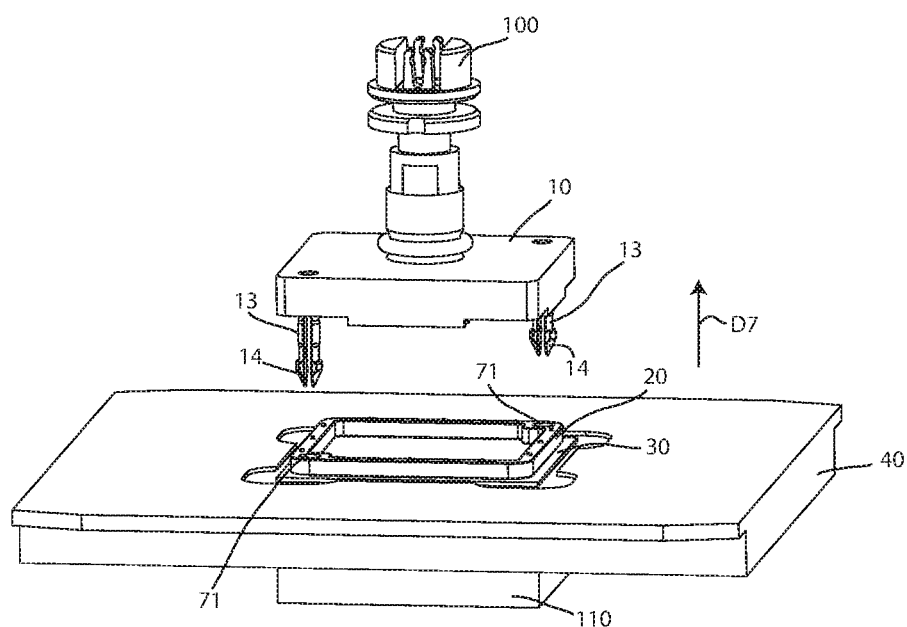
FIG. 15 is a side view of the nozzle of FIG. 9, the fixture of FIG. 9, the part of FIG. 10, the PCB and carrier of FIG. 12, and the fixture stripper of FIG. 14, the fixture stripper having facilitated the removal of the snap fit features of the fixture from the carrier.

Referring to FIG. 15, a side view of the nozzle 100 having lifted the fixture 10 from the carrier 40 in direction D7 is shown. The alignment pins 13 have been removed from the retaining feature openings 72 of the PCB and the retaining feature openings 71 of the part 20. The fixture stripper 110 may be moved in direction D6 away from the carrier 40. The carrier 40 and fixture 10 may then be reused, or may be disposable.

A method of clamping a part, such as part 20, to a work object such as PCB 30 may include providing a fixture such as fixture 10 having a retaining feature such as alignment pin 13 and bayonet tip 14, and magnet tip 9, providing a part such as part 20, providing a work object such as PCB 30 on a carrier such as carrier 40, placing the part in between the fixture and the work object on the carrier such that the part and the substrate are clamped together between the fixture and the carrier.

The placing the part in between the fixture the part in between the fixture and the work object on the carrier may include picking the part by a pick and place nozzle, such as nozzle 100, inserting the retaining feature into a retaining feature opening of the part, such as retaining feature opening 71 and inserting the retaining feature into a retaining feature opening of the work object, such as retaining feature opening 72.

The securing the retaining feature to the carrier may include attaching a magnet to a magnetic portion of the carrier.

A method of clamping a part to a work object may include providing wet solder paste on at least one of the part and the work object.

A method of clamping a part to a work object may include subjecting the fixture, part, work object, and carrier to a reflow process such that the part and work object are soldered together.

A method of clamping a part to a work object may include removing a fixture from the part and work object by a pick and place nozzle.

A retaining feature may include at least one alignment pin, such as alignment pin 13, configured to releasably secure to the carrier.

An alignment pin in a method of clamping a part to a work object may include a bayonet tip such as bayonet tip 14 at the end of the alignment pin, and the method of clamping a part to a work object may include compressing the bayonet tip by a fixture stripper such that the fixture is releasable from the carrier.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of clamping a part to a work object, comprising:
   providing a fixture having a retaining feature;
   providing a part;
   providing a work object on a carrier;
   placing the part in between the fixture and the work object on the carrier;
   securing the retaining feature to the carrier such that the part and the work object are clamped together between the fixture and the carrier; and
   removing, by a pick and place nozzle, the fixture from the part and the work object.

2. The method of clamping a part to a substrate of claim 1, wherein the placing the part in between the fixture and the work object on the carrier comprises:
   picking, by a pick and place nozzle, the part;
   inserting the retaining feature into a retaining feature opening of the part; and
   inserting the retaining feature into a retaining feature opening of the work object.

3. The method of clamping a part to a work object of claim 2, wherein the retaining feature comprises a magnet and wherein the carrier comprises a magnetic portion configured to attach to the magnet by a magnetic force, wherein the securing the retaining feature to the carrier comprises attaching the magnet to the magnetic portion.

4. The method of clamping a part to a work object of claim 1, further comprising providing wet solder paste on at least one of the part and the work object.

5. The method of clamping a part to a work object of claim 1, further comprising subjecting the fixture, part, work object, and carrier to a reflow process such that the part and work object are soldered together.

6. The method of clamping a part to a work object of claim 1, wherein the retaining feature comprises at least one alignment pin configured to releasably secure to the carrier.

7. The method of clamping a part to a work object of claim 6, wherein the at least one alignment pin comprising a bayonet tip at the end of the at least one alignment pin; wherein the method further comprises:
   compressing, by a fixture stripper, the bayonet tip such that the fixture is releasable from the carrier.

\* \* \* \* \*